(12) United States Patent
Holst et al.

(10) Patent No.: US 6,391,385 B1
(45) Date of Patent: May 21, 2002

(54) METHOD OF ABATING OF EFFLUENTS FROM CHEMICAL VAPOR DEPOSITION PROCESSES USING ORGANOMETALLIC SOURCE REAGENTS

(75) Inventors: Mark Holst, San Jose, CA (US); Ray Dubois, Mesa, AZ (US); Jose Arno, Brookfield, CT (US); Rebecca Faller, Campbell, CA (US); Glenn Tom, New Milford, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/420,108

(22) Filed: Oct. 18, 1999

(51) Int. Cl.$^7$ .................................. C01B 31/08
(52) U.S. Cl. .................. 427/250; 423/226; 423/230
(58) Field of Search ............... 427/248.1, 250; 423/220, 226, 230, 236, 239.1

(56) References Cited

U.S. PATENT DOCUMENTS

| | | | | |
|---|---|---|---|---|
| 5,037,624 A | * | 8/1991 | Tom et al. | 423/210 |
| 5,320,817 A | * | 6/1994 | Hardwick et al. | 423/237 |
| 5,622,682 A | * | 4/1997 | Tom | 423/230 |
| 5,704,965 A | * | 1/1998 | Tom et al. | 95/95 |
| 6,132,492 A | * | 10/2000 | Hultquist et al. | 95/45 |

OTHER PUBLICATIONS

Zorcih, Bob et al., "Safety and environmental concerns of CVD copper precursors" Solid State Technology, vol. 41 No. 9, Sep. 1998, pp. 101–106.*

Mendicino, Laura et al., "The Environment, Health, and Safety Side of Copper Metalization" Semiconductor International, Jun. 1998, pp. 105–110.*

B. Zorich & M. Majors, "Safety and Environmental concerns of CVD copper precursors" *Solid State Tech.*, Sep. 1998, pp. 101–106.

Laura Mendicino, Paul Thomas Brown, "The environment, health and safety side of copper metalization," *Semiconductor Inter.*, Jun. 1998, pp. 105–110.

* cited by examiner

Primary Examiner—Bret Chen
(74) Attorney, Agent, or Firm—Margaret Chappius; Marianne Fuierer; Robert A. McLauchlan

(57) ABSTRACT

A method and apparatus for abatement of effluent from a CVD process using a source reagent having a metal organic loosely bound to a organic or organomettalic molecule such that upon exposure to heat such bond is readily cleavable, e.g., copper deposition process involving the formation of films on a substrate by metalorganic chemical vapor deposition (CVD) utilizing a precursor composition for such film formation. The abatement process in specific embodiments facilitates high efficiency abatement of effluents from copper deposition processes utilizing Cu(hfac)TMVS as a copper source reagent.

59 Claims, 1 Drawing Sheet

METHOD OF ABATING OF EFFLUENTS FROM CHEMICAL VAPOR DEPOSITION PROCESSES USING ORGANOMETALLIC SOURCE REAGENTS

BACKGROUND OF THE INVENTION

1. Field of the Invention

The present invention relates to a method and apparatus for abatement of effluent from any CVD process using a source reagent having a metal organic loosely bound to an organic or organometallic molecule such that upon exposure to heat such bond is readily cleavable e.g., abatement of effluents from processes involving the deposition of copper on a substrate by chemical vapor deposition (CVD).

2. Description of the Related Art

Copper deposition has become one of the most important and rapidly growing areas in integrated circuit manufacturing. Deposition of copper can be accomplished by various techniques, with chemical vapor deposition (CVD) becoming progressively more widespread.

The precursors used in copper CVD, however, are relatively new and limited information has been published on their abatement. One of the major chemistries currently being employed for CuCVD utilizes Cu(hfac)TMVS as a copper source reagent. This precursor, Cu(hfac)TMVS, wherein hfac=1,1,1,5,5,5-hexafluoroacetylacetonato and TMVS is trimethyl vinyl silane, $CH_2$=CH—$Si(CH_3)_3$, is commercially available from Schumacher Division of Air Products and Chemicals, Inc. (Allentown, Pa.) under the trademark CupraSelect.

In the CupraSelect™ process, the generally accepted mechanism for the deposition of copper from the Cu(hfac)TMVS precursor by CVD involves the liberation of TMVS on the wafer surface and its intact desorption. This is followed by collision and disproportionation of two Cu(I)(hfac) molecules, to yield Cu(0) (metal) and Cu(II)(hfac)$_2$. Copper metal thereby is incorporated in the growing film, while Cu(II)(hfac)2 desorbs therefrom.

Under certain process conditions, Hhfac ($CF_3$—CO—CH=COH—$CF_3$), the protonated, acidic form of hfac, is produced in the film formation process. This can occur as a result of the addition or presence of water. Alternatively, Hhfac can form in consequence of the use of $H_2$ as a reducing gas in the CVD process.

Thus, in the use of Cu(hfac)TMVS as a copper source reagent for CVD, the reaction by-products of the copper deposition process include Hhfac, TMVS and Cu(II)(hfac)$_2$. These reaction by-products are correspondingly present in the effluent from the copper CVD process when Cu(hfac)TMVS is employed as a copper source reagent, and require abatement in the treatment of the effluent gas from the process.

One of the major process challenges in the CupraSelect™ process relates to the fact that the Cu(hfac)TMVS precursor tends to decompose in the hot environment of the dry vacuum pumps that are used in the process. This decomposition produces corresponding decomposition products that severely shorten vacuum pump life.

Schumacher has developed a technique for the abatement of waste gas species from the CupraSelect™ process. In this abatement technique copper CVD species escaping the CVD process chamber are passed through a heated section of the vacuum line downstream from the CVD chamber, and upstream of the vacuum pump, so that the copper species are converted into volatile materials (Cu(hfac)$_2$ and TMVS, with deposition of copper on the heated section internal surfaces). These volatile materials subsequently pass through the dry vacuum pumps without deposition and without attendant pump damage from deposited solids. The valuable hfac material is recovered downstream from the dry vacuum pump in a cold trap, which condenses the Cu(hfac)$_2$ while allowing the TMVS to pass through. The valuable Cu(hfac)$_2$ can then be collected and recycled to an upstream Cu(hfac)TMVS manufacturing operation.

The Schumacher technique is described in detail in "Safety and environmental concerns of CVD copper precursors," B. Zorich and M. Majors, *Solid State Technology;* September 1998, pp. 101–106.

Despite its utility, the Schumacher efficient abatement technique suffers from a number of deficiencies.

One major deficiency relates to the fact that there is a significant amount of Cu(hfac)TMVS and Cu(hfac)$_2$ passing through the process system, which can result in excessive copper emissions in the discharge vent gas.

Another deficiency of the Schumacher technique relates to the fact that significant amounts of free TMVS pass through the process system. TMVS is highly flammable, having a flashpoint of −19° C., and a lower explosive limit (LEL) of 0.5% in air.

A further deficiency of the Schumacher technique relates to the fact that the cold trap is not very efficient for removing Cu(hfac)$_2$. The cold trap also presents significant operational difficulties, since the cold trap must be removed and separately processed in order to recover Cu(hfac)$_2$.

The semiconductor manufacturing industry, and other industrial operations that utilize CupraSelect™ reagents for formation of copper on substrates, would therefore be greatly benefited by a process that overcomes the aforementioned disadvantages.

The foregoing issues are not unique to the CupraSelect™ process or other copper metallization processes using other Cu CVD precursors, such as Cu(hfac)-R where R is any of a series of organic or organometallic molecules. Some examples include Cu(hfacac)-3-hexyne, ($C_5HF_6O_2$)Cu—($C_6H_{10}$), and Cu CVD precursors containing organo moieties such as 3-hexyne ($CH_3$—$CH_2$—C≡C—$CH_2$—$CH_3$), dimethylcyclooctadecene (DMCOD) and 3-methylhex-eneyne (3MHY). These issues also apply to other CVD processes which use a source reagent having a metal organic loosely bound to a organic or organometallic molecule such that upon exposure to heat such bond is readily cleavable.

SUMMARY OF THE INVENTION

The present invention relates to a method and apparatus for abatement of effluent from any CVD process using a precursor (source reagent) having a metal organic loosely bound to a organic or organometallic molecule such that upon exposure to heat such bond is readily cleavable. More particularly, the present invention relates to a method and apparatus for abatement of effluent from a process for depositing copper on a substrate from an organocopper source reagent.

In one aspect, the invention relates to a method wherein the effluent from the CVD process is contacted with a sorbent having sorptive affinity for the organometallic source reagent, as well as for byproduct species deriving from the deposition process utilizing such source reagent.

The sorbent may comprise a physical sorbent and/or a chemisorbent, as desired to effect desired abatement of effluent species.

A pump may be disposed upstream of the sorbent, and arranged to maintain predetermined pressure conditions in the upstream deposition process, with (1) a pre-pump heating device operative to at least partially convert organocopper species in the effluent to conversion products that are less susceptible to deposition in the pump, and/or (2) a post-pump cold trap operative to remove condensable and/or solidifiable components from the effluent.

The above-described method may further comprise monitoring the effluent discharged from the sorbent contacting step, to detect breakthrough of a selected component, e.g., by a quartz microbalance detector.

The invention in another aspect relates to an apparatus for abatement of effluent from a CVD process using an organometallic source reagent, such apparatus comprising:

a sorbent bed having sorptive affinity for the source reagent and byproduct species deriving from the source reagent; and a flow path joining the process in gas flow communication with the sorbent bed so that effluent is flowed through the sorbent bed, to at least partially remove source reagent and deposition byproduct species from the effluent.

A pump may be disposed upstream of the sorbent, and arranged to maintain predetermined pressure conditions in the upstream deposition process, with (1) a pre-pump heating device operative to at least partially convert organocopper species in the effluent to conversion products that are less susceptible to deposition in the pump, and/or (2) a post-pump cold trap operative to remove condensable and/or solidifiable components from the effluent.

The apparatus may further comprise an endpoint sensor operatively arranged to sense breakthrough of one or more effluent components in effluent from the sorbent bed.

The apparatus may further include a semiconductor manufacturing facility in which copper is deposited on a substrate, e.g., by a CVD process.

Other aspects and features of the invention will be more fully apparent from the ensuing disclosure and appended claims.

DETAILED DESCRIPTION OF THE INVENTION, AND PREFERRED EMBODIMENTS THEREOF

Figure 1:
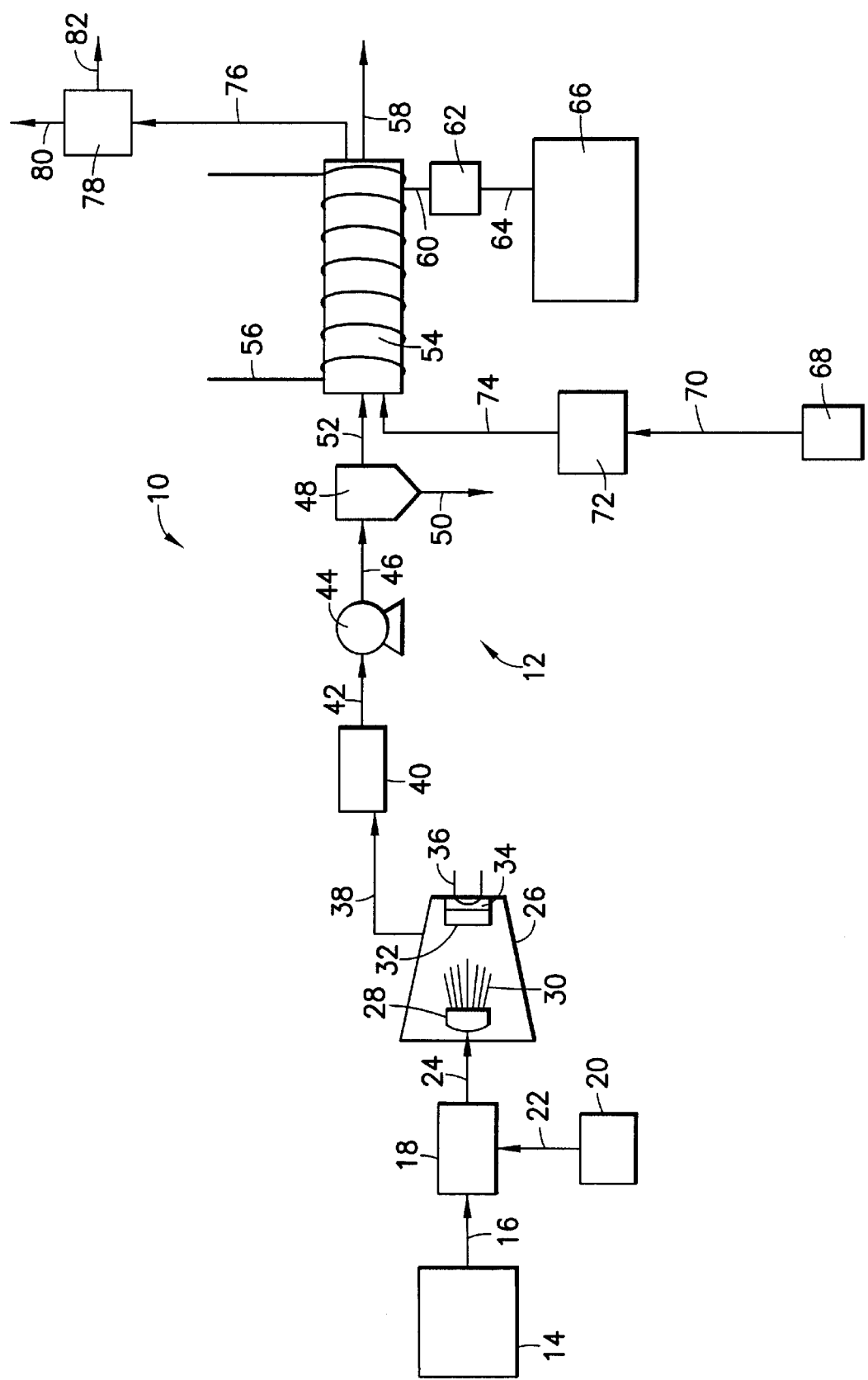
FIG. 1 is a schematic representation of a thin film fabrication facility including an effluent abatement system according to one embodiment of the present invention.

The present invention provides an effluent abatement system for treatment of effluent streams from any CVD process using a source reagent or precursor having a metal organic loosely bound to a organic or organometallic molecule such that upon exposure to heat such bond is readily cleavable. More particularly, the present invention relates to a method and apparatus for abatement of effluent from copper deposition processes.

In a specific embodiment described hereinafter, effluent from a CupraSelect™ CVD process is subjected to treatment.

Although illustratively described herein with reference to a specific embodiment involving treatment of effluent from a CupraSelect™ process, it will be recognized that the apparatus and methodology disclosed herein may be widely and effectively employed for the abatement of streams deriving from operations involving any CVD process using a source reagent or precursor having a metal organic loosely bound to a organic or organometallic molecule such that upon exposure to heat such bond is readily cleavable including a wide variety of other copper source reagents.

The abatement apparatus and methodology of the invention may be efficiently utilized with the optional end point detection capability hereafter described, to determine the approach to exhaustion of the sorbents that are used in abating organic and organometallic species in effluent streams containing same. Such determination in turn may be employed for change-out of the sorbent medium approaching exhaustion, or alternatively, such determination may be employed to effect switch-over from an exhausted sorbent medium, e.g., in a scrubbing unit containing same, to a fresh scrubbing unit, for uninterrupted operation of the process system.

For ease of reference in the ensuing discussion, a generalized description is set out below of FIG. 1, showing a schematic representation of a thin film fabrication facility 10 including an effluent abatement system 12 according to one embodiment of the present invention.

In the FIG. 1 facility, an organometallic source reagent or precursor material is furnished from source 14 thereof. The source 14 may comprise a reservoir containing a solution of the precursor material, or the precursor in neat form, if it is in a liquid state at the supply conditions. Alternatively, the source 14 may comprise a blending or synthesis unit wherein the precursor is made or formulated in the first instance.

From the source 14, the liquid precursor flows in line 16 to the vaporizer unit 18, wherein the liquid precursor is flash vaporized for volatilization thereof to form corresponding precursor vapor. Concurrently, if desired, a carrier gas, such as argon, helium, hydrogen, etc., is flowed from the carrier gas source 20 in line 22 to the vaporizer unit 18. The carrier gas thus entrains the precursor vapor and forms a precursor vapor mixture.

The precursor vapor mixture flows in line 24 from the vaporizer unit 18 to the CVD reactor 26, being dispersed in the interior volume of the reactor by showerhead discharge device 28 as a vapor flow stream 30. This stream of precursor vapor mixture thereby is directed to and impinges on a wafer substrate 32 positioned on susceptor 34 heated by heating element 36. The wafer substrate is maintained at a sufficiently elevated temperature to cause decomposition of the precursor vapor mixture and chemical vapor deposition of the desired component of the precursor on the surface of the wafer substrate.

An effluent comprising waste gases and decomposition by-products is discharged from the reactor 26 and flows in line 38 to the effluent abatement system 12.

The effluent abatement system 12 optionally comprises a pre-pump heating device 40 that may comprise any suitable means for heating the effluent to appropriate temperature. Such means may for example comprise a heat exchanger through which the effluent is flowed, a heat-tracing on the line 38, an embedded resistance heating element disposed in the line for heating of the effluent gas stream as it flows therethrough, a packed column of high heat capacity packing elements that are continuously or intermittently heated, e.g., by infrared heating means, a heat pipe unit, or any other means by which the effluent is suitably heated to appropriate temperature.

From the optional pre-pump heating device 40, the effluent flows in line 42 to the pump 44, which serves as a motive fluid driver for the effluent stream. While a pump is illustratively shown, it will be appreciated that any other motive fluid driver may be employed, e.g., a compressor, eductor, turbine, fan, blower, etc. The pump may be constructed and operated to provide an appropriate pressure level in the upstream reactor 26, e.g., a subatmospheric pressure level.

The pump 44 discharges the effluent into discharge line 46, from which it flows to the optional post-pump cold trap 48. In the cold trap 48, condensable and/or solidifiable components may be extracted from the effluent under appropriate temperature conditions, and discharged from the cold trap in line 50 for recovery and/or reuse. The treated effluent is flowed from the cold trap 48 in line 52 to the sorbent bed 54.

The sorbent bed 54 suitably comprises a vessel containing a sorbent material having sorptive affinity for the components of the effluent that are to be removed. Sorbent materials may include physical adsorbent(s) and/or chemisorbent(s), as desired and appropriate to the removal operation to be carried out.

Although illustratively shown as comprising a single adsorber unit, the sorbent bed may in fact be a multiple bed arrangement comprising sorbent beds variously connected in series and/or parallel (manifolded) arrangements.

After sorptive treatment in the sorbent bed 54, the resultantly treated effluent is flowed from the sorbent bed in line 58, and may be discharged to the atmosphere or further treated or processed, as necessary or desired in a given end use application of the invention.

For regeneration purposes, the vessel containing the sorbent bed may be wrapped with a heating coil 56. The heating coil may comprise an electrical resistance heating tape, a stream-tracing line, a heat exchange coil through which a suitable heat transfer fluid may be selectively flowed, or any other appropriate heating means. Alternatively, the vessel may be jacketed, to permit flow of a heat exchange fluid through the jacket for heating the sorbent material contained in the vessel.

As an additional feature accommodating regeneration of the sorbent bed, the sorbent bed may be coupled with a source 68 of a regeneration fluid, which is selectively flowable in line 70 to the heater 72 for heating to elevated temperature appropriate to effect desorption of the sorbed species from the sorbent bed during the regeneration operation.

The resultantly heated fluid is flowed from the heater 72 in line 74 to the sorbent bed, and flows therethrough to effect desorption.

It will be appreciated that the heater 72 is optional and that in some instances the desired desorption of the sorbed species from the sorbent bed may be effected solely by mass transfer as a result of a concentration differential between the sorbent and the regeneration gas flowing through the sorbent bed.

The sorbent bed is also equipped with a discharge line 76 for efflux of the regeneration gas subsequent to its contacting with the sorbent in the sorbent bed. The line 76 may be coupled with a recovery unit 78, in which separation of the desorbate gas may be effected, to recover components thereof for final disposition, recycle or other use. In the illustrated recovery unit, the desorbate gas is separated into a first fraction, which is discharged from the recovery unit in line 80, and a second fraction, which is discharged from the recovery unit in line 82.

Any other suitable means and modes of regeneration of the sorbent bed may usefully be employed.

At the outlet end of the sorbent bed 54 is provided an effluent tap line 60, which conveys a side-stream of the effluent gas to an endpoint detector 62, as hereinafter more fully described.

The endpoint detector 62, upon detecting the breakthrough or incipient breakthrough of one or more species in the effluent being monitored, generates a control signal that is transmitted in transmission line 64 to the central processing unit (CPU) 66, which may be operatively arranged to effect a corresponding action in the facility.

For example, the system may be arranged so that on incipient breakthrough detection by the endpoint detector, the effluent flow is diverted to a second sorbent bed, or to a holding (surge) vessel for retention until the regeneration of the sorbent bed has been carried out.

Alternatively, or additionally, such endpoint breakthrough detection may be employed to initiate a regeneration sequence, to renew the exhausted sorbent bed for subsequent on-stream operation.

The features and layout of the semiconductor manufacturing facility shown in FIG. 1 are illustrative in character only, and any other suitable features, arrangements and operation may be advantageously employed.

An embodiment of the invention for abatement of effluent from an illustrative CupraSelec™ process will now be described.

In such embodiment, a bed of chemisorbent or physisorbent material is employed after the pump, to remove any residual Cu(hfac)TMVS, Cu(hfac)$_2$, and TMVS in the effluent deriving from the upstream CupraSelec™ process. This sorbent material may also be utilized to capture H(hfac), H(hfac) dihydride and metallic copper passing through the system. Small innocuous organic fragments from the upstream CVD process chamber may be adsorbed by the sorbent bed or the sorbent bed may be constructed so that such fragments pass through the bed. The bed may be of any suitable type, e.g., a fixed bed, a trickle bed, a fluidized bed, a recirculating fluidized bed, etc.

The sorbent bed optionally may be used in conjunction with a pre-pump heating device (pre-pump here being used to denote an upstream position preceding the pump in the line discharging effluent from the chemical vapor deposition reactor), to convert the Cu(hfac) TMVS to Cu(hfac)$_2$ and an adduct moiety. Alternatively, no pre-pump heating device may be necessary.

The sorbent bed additionally or alternatively may be optionally used in conjunction with a post-pump cold trap for removing Cu(hfac)$_2$. In some instances, no post-pump cold trap is necessary.

The abatement system of the invention may therefore variously comprise: a) a sorbent bed, b) a pre-pump heated tube, a pump, and the sorbent bed, c) a pre-pump heated tube, a pump, a post-pump cold trap, and the sorbent bed, or d) any other configuration utilizing suitable components selected from, or at a minimum including, one or more of these listed items.

In an illustrative configuration, the sorbent bed comprises a bed of suitable sorbent material, e.g., high surface area activated carbon. Such sorbent material will remove heavy organometallic species, as well as the precursor adduct molecule. Activated carbon may be used in any of a number of grades, including high purity bead activated carbon, coconut carbon, bituminous carbon, etc. The sorbent may alternatively comprise carbon impregnated with permanganate, or Wetlerite™ carbon with some metal oxide content providing oxidative properties to the sorbent material.

In addition, special catalytic carbons can be used, such as those commercially available from Calgon Carbon Corporation as part of their Centaur product line. These carbons are formulated to have especially high catalytic properties, but without the addition of metal oxides. Illustrative Centaur carbons include those described in U.S. Pat. No. 5,356,849 and U.S. Pat. No. 5,494,869, the disclosures of which are hereby incorporated herein by reference in their entireties.

In addition to, or instead of, activated carbon, a high surface area alumina can be used to physically adsorb the $Cu(hfac)_2$ and Cu(hfac)TMVS, as well as to physically trap the $Cu(hfac)_2$ and any H(hfac). A "wet" alumina may be employed if desired. A high surface area alumina may be impregnated with a strong oxidizer, such as $KMnO_4$, to partially oxidize the TMVS. $CuSO_4$-impregnated silica gel may also be employed to provide a lesser oxidizing action, as desired.

In this respect, some oxidizer species that are effective for species such as $SiH_4$, due to the favored tendency of oxygen from the oxidizer agent to bond with Si, are not sufficiently strong to oxidize TMVS, since in TMVS the silicon atom is surrounded or buffered by carbon atoms.

$KMnO_4$ is of sufficient strength to oxidize the TMVS to alcohols, e.g., trimethyl silanol (($CH_3)_3SiOH$), ethanol ($CH_3CH_3OH$) and $(CH_3)_3SiCH_2CH_2OH$. An alumina bed will have some affinity for these alcohols; alternatively, a carbon bed after the alumina bed may be employed so that partially oxidized TMVS fragments are adsorbed on the alumina or the activated carbon, while innocuous fragments pass through the system.

In addition to, or instead of activated carbon and/or high surface area alumina, $Cu_2O$ can be employed to both physically remove and partially react the TMVS-related species.

$Cu_2O$ can be utilized in the effluent abatement system to react the incoming species of H(hfac) and TMVS, to yield Cu(hfac)TMVS, which can subsequently be abated with an activated carbon bed or a bed of alumina. The $Cu_2O$ in this manner is irreversibly reacted according to the following reactions:

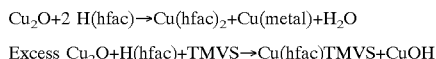

Using excess $Cu_2O$ reduces the first reaction. The above reactions effectively trap the H(hfac) and, to a lesser degree, TMVS. Such trapping action may be particularly attractive in the event that a pre-pump heated tube and/or cold trap is not used, since it allows incoming gases to yield $Cu(hfac)_2$ and Cu(hfac)TMVS, which are readily abated in the practice of the invention.

Another approach is to utilize a bed of alumina over a bed of $Cu_2O$. The alumina in the overlying bed will physisorb the $Cu(hfac)_2$. The $Cu_2O$ can then be used to react with the process effluents to form Cu(hfac)TMVS. This approach is particularly advantageous when provision is made to trap the resultant Cu(hfac)TMVS at the end of the abatement treatment.

Still another approach is to utilize a bed of alumina (or alumina impregnated with a strong oxidizer) over a bed of carbon, as a component of the abatement system.

The abatement system may further, optionally comprise an endpoint detection device, as a means of detecting endpoint or depletion of the sorbent material. The endpoint detection device may for example comprise:

a) a piezoelectric quartz crystal microbalance, with the quartz crystal coated with a thin film coating having affinity for a component of the gas;

b) a colorimetric material, such as $KMnO_4$-impregnated alumina, which can be located in a sightglass (protected from normal light in order to prevent colorimetric property degradation), and which will change color upon oxidation;

c) a thermal conductivity detector on the exhaust of the system; and/or d) an infrared (IR) device, such as a non-dispersive infrared (NDIR) system.

Any of various other endpoint detection schemes could alternatively be used.

The abatement device can also be combined with a method and apparatus for recycle of the hfac material, if a reversible physisorptive material is employed as the sorbent medium. Upon depletion, the spent canister of physisorbent/chemisorbent material can be removed from the effluent abatement system and can be returned to a regeneration site. At this site heat, vacuum, or both, can be applied to the bed, thereby revolatilizing some or all of the physically adsorbed material. In certain cases when carbon is used as a physisorbent material, it may be advantageous to pyrolyze the carbon, to volatilize the sorbed species and effect their release from the sorbent.

Due to the differing physisorption characteristics of organic and organo-metallic species, the various adsorbed species will elute at different times in the regeneration heat-up or vacuum cycle.

This chromatographic characteristic of the process can be used to separate the valuable sorbate components of the effluent gas from the non-valuable sorbate components. The valuable sorbate components can then be recycled back to the precursor manufacturing process, while the non-valuable components can be disposed of by other means, such as incineration.

Alternatively, the non-valuable sorbate components can be left on the adsorbent media and the adsorbent media can be either incinerated or landfilled. In yet another alternative approach, the regenerated physisorbent/chemisorbent material can be recycled and reused in the Cu CVD effluent abatement process itself.

The present invention also contemplates an apparatus for the regeneration of the spent physisorbent/chemisorbent material. This device comprises a heating element, preferably of a conductive contact or a radiative infrared type, e.g., wrapped around the canister to be regenerated. This first heater prevents heat losses from the bed and eliminates cold spots along the walls, as well as forcing heat into the bed itself.

The first heater will typically rely on conductive mechanisms to transfer heat within the bed itself. In this respect, the thermal conductivity of porous beds is typically poor due to the point- and/or small area-contacts that provide the conductive path for heat transfer. For large diameter beds, this discontinuity of the heat conduction path (due to void volume and interstitial spaces) may be insufficient to allow acceptably short heat-up times for the bed to be achieved, and other heating means and method must be alternatively employed.

Accordingly, where large diameter beds are employed, it may be desirable to use a second convective heater assembly whereby a carrier gas (such as $N_2$, Ar, air, etc.) is passed through a heating device to raise the gas temperature, and the resultantly heated gas is then passed through the physisorbent/chemisorbent bed to be regenerated. In this manner, heat from the carrier gas is applied to the bed.

This second convective heater may be filled with heat transfer enhancement media, such as turbulators, spheres, packing media such as Pall® rings or Intalox® saddles, twisted tape inserts, delta wing inserts, or spiral wound wire inserts (such as those manufactured by Cal Gavin).

The second convective heater may utilize a direct, electrically heated element, or it may use indirect heating (such as inductive heating, etc) to heat the carrier gas. Combustion-based heating may also be used if such mode of heating is compatible with the sorbent material; combustion-based heating should generally not be employed with activated carbon sorbents, due to the flammable nature of many activated carbon compositions.

A vacuum device with throttling means (such as a valve, or a variable flow device (VFD)) may also be provided for vacuum regeneration of the canister. The exhaust of the canister or the vacuum pump may then be fed into a recovery unit, e.g., a condenser, a feed line into a precursor manufacturing unit (whereby the recovered component is reused for synthesis of the source reagent), a reaction vessel, or a distillation recovery process unit.

As an illustrative embodiment of one endpoint detection system in accordance with the present invention, a test was run using a quartz microbalance (QMB) sensor element coated with a simple polymeric coating having affinity for the organic and organometallic components of the effluent.

The polymeric coating is non-reactive with the targeted organic and organometallic species, but has the property of establishing an equilibrium between the vapor phase organic/organometallic species and the same species adsorbed on the polymeric coating. As a result of this equilibrium, when little or no organic passes through the scrubber vessel, little or no organic is adsorbed onto the polymeric coating of the QMD sensor.

However, when organics start to pass through the scrubber, equilibrium constraints cause some of the organic to be adsorbed onto the polymeric coating of the QMB. This resultantly effects a weight change of the QMB and a concomitant change in the frequency output of the QMB. Such change in frequency output may be used to trigger a signal of a suitable type (auditory, visual, tactile, etc.) indicating that the canister has reached endpoint and requires change-out.

This endpoint detection scheme is very versatile in that any of a number of coatings, including hydrophobic or hydrophilic coatings, can be applied to the QMB in order to target specific organic or organometallic species of interest. The QMB sensor preferably utilizes reversible chemistry, so that a slow bleed of organic through the system does not cause false "trips" of the system.

For detection of TMVS, the QMB (AT-cut quartz crystal) may be coated with Carbowax 20M (polyethylene glycol with molecular weight 20,000 grams per mole) by spray coating a solution of 0.33 grams of Carbowax in about 200 ml of MeOH/acetonitrile (20:75 v:v). The active loading of the polymer is about 2 milligrams total which translates to about an 8000 Hz. frequency shift on the crystal from the uncoated base frequency.

Such QMB technology also can be used in conjunction with various selective adsorbents or traps, in order to allow only target species to pass through to the sensor. For instance, if the QMB sensor coating may tend to physisorb $H_2O$ molecules in circumstances where $H_2O$ is present or may be highly variable in concentration, then a water removal unit, e.g., a Permapure® filter, may be used to remove the bulk of the $H_2O$ molecules from the effluent being monitored by the QMB endpoint detector.

Alternatively, other low cost means of endpoint monitoring may be utilized in the broad practice of the present invention. For example, Kitigawa tubes may be used, having chemistries utilizing Cr(VI) or Cr(VI) and $H_2SO_4$. Some of these tubes give color changes when the monitored component is present and others do not, but such tubes utilize chemistries that can be used as a simple endpoint monitoring means.

Specific endpoint monitoring means may for example comprise:
  a) the use of sample tubes with Cr(VI) or Cr(VI)+$H_2SO_4$ characteristics, for periodic "spot sampling" of the exhaust stream of the CVD reactor,
  b) the incorporation of a sight glass on the scrubber canister, with Cr(VI) or Cr(VI)+$H_2SO_4$ chemistry impregnated onto the resin behind the sight glass, so as produce a visually discernible color change as the end portion of the scrubber resin (sorbent material) is contacted by organic molecules of interest, or
  c) the incorporation of Cr(VI) or Cr(VI)+$H_2SO_4$ chemistry in an automated monitor using a colorimetric sensing tape, such as that manufactured by Zellweger Analytics and employed in their company's MDA line of monitoring systems.

Another example of a chemistry that is potentially usefully employed in the broad practice of the invention comprises a high surface alumina absorbent loaded with $KMnO_4$ for colorimetric indication upon exposure to organic molecules. A distinct color change is observable after reaction with organic species. This strong oxidizing chemistry can be used in conjunction with any of the physical methods described hereinabove in order to detect an endpoint condition.

For abatement of Cu(hfac)TMVS or Cu(hfac)-organic ligand species, a bed of high surface area organic adsorbent can be used, such as carbon, or organic polymer adsorbents such as Dow Sorbathene® pellets or Rohm and Haas Amberlite® pellets. A bed of high surface inorganic material can also be used, such as alumina, molecular sieve, silica gel, hydrophobic zeolites, hydrophilic zeolites, etc. In addition, a bed of high surface area adsorbent (either organic or inorganic) impregnated with a strong oxidizer, such as $KMnO_4$, could also be utilized for some or all of the sorbent bed.

Thus, while the invention has been described herein with reference to specific features and illustrative embodiments, it will be recognized that the utility of the invention is not thus limited, but rather extends to and encompasses other features, modifications and alternative embodiments, as will readily suggest themselves to those of ordinary skill in the art based on the disclosure and illustrative teachings herein. The claims that follow are therefore to be construed and interpreted, as including all such features, modifications and alternative embodiments within their spirit and scope.

What is claimed is:

1. A method for abatement of effluent from a process for depositing copper on a substrate from an organometallic copper source reagent, said method comprising contacting the effluent with a sorbent material having sorptive affinity for said copper source reagent and decomposition products thereof, to at least partially remove residual copper source reagent and decomposition products from the effluent, wherein said sorbent material is selected from the group consisting of inorganic sorbent and organic polymer sorbent.

2. The method of claim 1, wherein the sorbent material comprises a physical sorbent.

3. The method of claim 1, wherein the sorbent material comprises a chemisorbent.

4. The method of claim 1, wherein a pump is disposed upstream of the sorbent material, and said pump is operative to maintain predetermined pressure conditions in the copper deposition process.

5. The method of claim 4, further comprising a pre-pump heating device operative to convert source reagent in the effluent to decomposition species thereof.

6. The method of claim 5, further comprising a post-pump cold trap operative to remove residual decomposition products from the effluent.

7. A method for abatement of effluent from a CVD process for depositing copper on a substrate from a Cu(hfac)TMVS source reagent, said method comprising flowing the effluent from the CVD process through a sorbent bed having sorptive affinity for Cu(hfac)TMVS, Cu(hfac)$_2$ and TMVS, to remove residual Cu(hfac)TMVS, Cu(hfac)$_2$ and TMVS from the effluent, wherein said sorbent bed comprises a sorbent material selected from the group consisting of inorganic sorbent and organic polymer sorbent.

8. The method of claim 7, wherein the sorbent bed comprises a physical sorbent.

9. The method of claim 7, wherein the sorbent bed comprises a chemisorbent.

10. The method of claim 7, wherein the sorbent bed is effective to capture H(hfac), H(hfac) dihydride and metallic copper from the effluent flowed therethrough.

11. The method of claim 7, wherein the sorbent bed has a bed conformation selected from the group consisting of fixed beds, trickle beds, fluidized beds, and recirculating fluidized beds.

12. The method of claim 7, wherein a pump is disposed upstream of the sorbent bed, and is operative to maintain predetermined pressure conditions in the CVD process.

13. The method of claim 12, further comprising a pre-pump heating device operative to convert Cu(hfac)adduct species in the effluent to Cu(hfac)$_2$ and adduct moieties.

14. The method of claim 12, further comprising a post-pump cold trap operative to remove Cu(hfac)$_2$ from the effluent.

15. The method of claim 13, further comprising a post-pump cold trap operative to remove Cu(hfac)$_2$ from the effluent.

16. The method of claim 7, wherein the sorbent bed comprises an activated carbon sorbent.

17. The method of claim 16, wherein the activated carbon sorbent includes a sorbent selected from the group consisting of bead activated carbon, coconut carbon, bituminous carbon, and mixtures thereof.

18. The method of claim 7, wherein the sorbent bed comprises a carbon sorbent.

19. The method of claim 18, wherein the carbon sorbent further comprises permanganate.

20. The method of claim 18, wherein the carbon sorbent further comprises a metal oxide.

21. The method of claim 7, wherein the sorbent bed comprises a catalytic carbon sorbent.

22. The method of claim 7, wherein the sorbent bed comprises an inorganic adsorbent material.

23. The method of claim 7, wherein the sorbent bed comprises an inorganic material selected from the group consisting of: alumina, molecular sieves, silica gels, zeolites.

24. The method of claim 7, wherein the sorbent bed comprises alumina impregnated with an oxidizer.

25. The method of claim 24, wherein the oxidizer comprises potassium permanganate.

26. The method of claim 7, wherein the sorbent bed comprises silica impregnated with copper sulfate.

27. The method of claim 7, wherein the sorbent bed comprises an adsorbent mass of activated carbon and an adsorbent mass of alumina.

28. The method of claim 7, wherein the sorbent bed comprises Cu$_2$O.

29. The method of claim 7, wherein the sorbent bed comprises Cu$_2$O and an adsorbent mass of activated carbon.

30. The method of claim 7, wherein the sorbent bed comprises Cu$_2$O and an adsorbent mass of alumina.

31. The method of claim 7, wherein the sorbent bed comprises an adsorbent mass of activated carbon and an adsorbent mass of alumina impregnated with an oxidizer.

32. The method of claim 7, further comprising monitoring the effluent discharged from the sorbent bed, to detect breakthrough of a selected component.

33. The method of claim 32, wherein the monitoring comprises exposure of the effluent to a colorimetric medium exhibiting a colorimetric change upon breakthrough of said selected component.

34. The method of claim 32, wherein the monitoring comprises detecting the thermal conductivity of the effluent.

35. The method of claim 32, wherein the monitoring comprises non-dispersive infrared monitoring.

36. The method of claim 32, wherein the monitoring comprises exposing the effluent to a quartz microbalance detector comprising a piezoelectric crystal having on a surface thereof a coating with affinity for the selected component of the effluent, whereby the piezoelectric crystal exhibits a change in frequency characteristics indicative of breakthrough of the selected component of the effluent.

37. The method of claim 36, wherein the coating exhibits reversible affinity for the selected component.

38. The method of claim 36, wherein the coating is selected from the group consisting of hydrophilic coatings and hydrophobic coatings.

39. The method of claim 32, further comprising removing water from the effluent before the effluent contacts the coating of the piezoelectric crystal.

40. The method of claim 32, wherein the monitoring comprises exposing the effluent to a chemistry comprising Cr(VI) or Cr(VI) and H$_2$SO$_4$.

41. The method of claim 32, wherein the monitoring comprises impregnating an outlet end portion of the sorbent bed with a colorimetric chemistry evidencing a visually discernible colorimetric change upon breakthrough of the selected component of the effluent, and disposing a sight glass in viewing relationship to the impregnated outlet end portion of the sorbent bed.

42. The method of claim 7, wherein hfac material is sorbed on the sorbent bed, and sorbed hfac is subsequently desorbed from the sorbent bed and recycled for synthesis of Cu(hfac)TMVS.

43. The method of claim 7, wherein the sorbent bed is regenerated by heat.

44. The method of claim 7, wherein the sorbent bed is regenerated by vacuum desorption of previously sorbed species therefrom.

45. The method of claim 7, wherein the sorbent bed is regenerated by pyrolysis.

46. The method of claim 7, wherein the sorbent bed is regenerated by desorbing previously sorbed species therefrom, wherein said desorbing is carried out under varied desorption conditions including a first desorption condition for desorbing a first desorbate component and a second desorption condition for desorbing a second desorbate component.

47. The method of claim 7, wherein the sorbent bed is regenerated in a first regeneration step involving conductive transfer of heat to the sorbent bed, and is regenerated in a second regeneration step involving convective heating by a heated gas flowed through the sorbent bed.

48. The method of claim 7, further comprising throttling the flow of gas through the sorbent bed to control vacuum pressure on the sorbent bed.

49. The method of claim 7, wherein effluent from the sorbent bed is flowed to a recovery unit for recovery of a selected component of the effluent.

50. The method of claim 49, wherein the recovery unit comprises a unit selected from the group consisting of condenser units, distillation units, synthesis units and reaction units.

51. The method of claim 7, wherein the sorbent bed comprises a sorbent material selected from the group consisting of carbon, organic polymers, alumina, molecular sieve, silica gel, hydrophilic zeolites, hydrophobic zeolites, and combinations thereof.

52. A method for abatement of effluent from a CVD process using a source reagent having a metal organic loosely bound to a organic or organometallic molecule such that upon exposure to heat such bond is readily cleavable, said method comprising flowing the effluent from the CVD process through a sorbent bed having sorptive affinity for said source reagent and decomposition products thereof, to at least partially remove residual source reagent and decomposition products from the effluent wherein said sorbent bed comprises a sorbent material selected from the group consisting of inorganic sorbent and organic polymer sorbent.

53. The method of claim 52, wherein a pump is disposed upstream of the sorbent bed, and is operative to maintain predetermined pressure conditions in the CVD process.

54. The method of claim 52, further comprising monitoring the effluent discharged from the sorbent bed, to detect breakthrough of a selected component.

55. The method of claim 54, wherein the monitoring comprises exposing the effluent to a quartz microbalance detector comprising a piezoelectric crystal having on a surface thereof a coating with affinity for the selected component of the effluent, whereby the piezoelectric crystal exhibits a change in frequency characteristics indicative of breakthrough of the selected component of the effluent.

56. The method of claim 55, wherein the coating exhibits reversible affinity for the selected component.

57. The method of claim 55, wherein the coating is selected from the group consisting of hydrophilic coatings and hydrophobic coatings.

58. The method of claim 55, further comprising removing water from the effluent before the effluent contacts the coating of the piezoelectric crystal.

59. The method of claim 54, wherein the monitoring comprises impregnating an outlet end portion of the sorbent bed with a colorimetric chemistry evidencing a visually discernible colorimetric change upon breakthrough of the selected component of the effluent, and disposing a sight glass in viewing relationship to the impregnated outlet end portion of the sorbent bed.

* * * * *

UNITED STATES PATENT AND TRADEMARK OFFICE
CERTIFICATE OF CORRECTION

PATENT NO. : 6,391,385 B1
DATED : May 21, 2002
INVENTOR(S) : Mark Holst et al.

It is certified that error appears in the above-identified patent and that said Letters Patent is hereby corrected as shown below:

<u>Column 6,</u>
Lines 25 and 29, delete "CupraSelec™" and substitute -- CupraSelect™ --.

<u>Column 11,</u>
Line 4, after "convert" insert -- said copper --.
Line 58, after "gels," insert -- and --.

Signed and Sealed this

Eleventh Day of February, 2003

JAMES E. ROGAN
*Director of the United States Patent and Trademark Office*